United States Patent
Rostaing

(10) Patent No.: US 9,496,858 B2
(45) Date of Patent: Nov. 15, 2016

(54) DEVICE FOR REGULATING A RANDOM STREAM OF VOLTAGE PULSES AT THE INPUT OF AN ANALOG-TO-DIGITAL CONVERTER

(71) Applicant: COMMISSARIAT A L'ENERGIE ATOMIQUE ET AUX ENE ALT, Paris (FR)

(72) Inventor: Jean-Pierre Rostaing, La Cote Saint-Andre (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/361,169

(22) PCT Filed: Nov. 29, 2012

(86) PCT No.: PCT/EP2012/073948
§ 371 (c)(1),
(2) Date: May 28, 2014

(87) PCT Pub. No.: WO2013/041733
PCT Pub. Date: Mar. 28, 2013

(65) Prior Publication Data
US 2014/0299744 A1    Oct. 9, 2014

(30) Foreign Application Priority Data
Dec. 2, 2011   (FR) ...................................... 11 61116

(51) Int. Cl.
*H03M 1/00*    (2006.01)
*H03K 5/01*    (2006.01)
(Continued)

(52) U.S. Cl.
CPC . *H03K 5/01* (2013.01); *G01J 1/44* (2013.01); *G01T 1/17* (2013.01); *H03M 1/12* (2013.01)

(58) Field of Classification Search
CPC .................. H03M 1/124; H03M 1/125; H03M 1/128
(Continued)

(56) References Cited

U.S. PATENT DOCUMENTS 5,173,683 A * 12/1992 Brighenti ............... G08B 17/00
                                                          340/505
2006/0012250 A1    1/2006 Ouvrier-Buffet et al.
(Continued)

FOREIGN PATENT DOCUMENTS

FR    2 847 676    5/2004
FR    2 951 037    4/2011

OTHER PUBLICATIONS

International Search Report issued Jan. 3, 2013, in PCT/EP12/073948, filed Nov. 29, 2012.

*Primary Examiner* — Thanh Luu
(74) *Attorney, Agent, or Firm* — Oblon, McClelland, Maier & Neustadt, L.L.P.

(57) ABSTRACT

A device converts a random stream of voltage pulses into a regulated stream of digital data. The device includes a stream regulation device and an analog-digital converter at the output of the stream regulation device. The converter undertakes an analog-digital conversion at a conversion frequency. The stream regulation device includes a buffer memory of capacity K, where K is an integer and K≥1, in which the voltage signal for each received pulse is stored. Reading of the buffer memory is regulated at the conversion frequency.

5 Claims, 9 Drawing Sheets

(51) Int. Cl.
*G01T 1/17* (2006.01)
*G01J 1/44* (2006.01)
*H03M 1/12* (2006.01)

(58) Field of Classification Search
USPC .................................................. 341/122–125
See application file for complete search history.

(56) References Cited

U.S. PATENT DOCUMENTS

| | | |
|---|---|---|
| 2007/0029494 A1 | 2/2007 | Caruba et al. |
| 2010/0152560 A1* | 6/2010 | Turcott ................ A61B 5/0816 600/323 |
| 2010/0283644 A1* | 11/2010 | Katsuki ............... H03M 1/1076 341/122 |
| 2011/0098980 A1 | 4/2011 | Ouvrier-Buffet et al. |

* cited by examiner

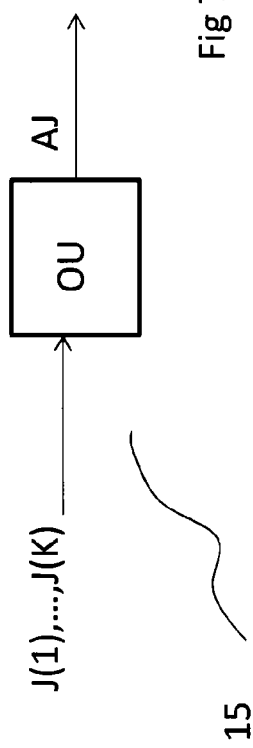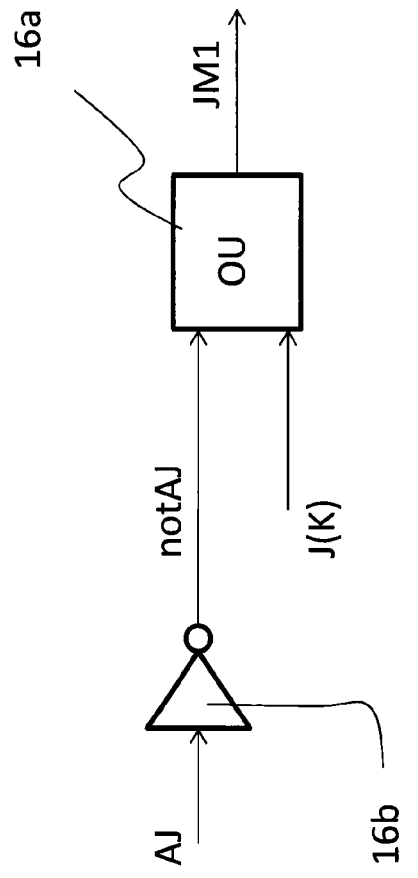

DEVICE FOR REGULATING A RANDOM STREAM OF VOLTAGE PULSES AT THE INPUT OF AN ANALOG-TO-DIGITAL CONVERTER

TECHNICAL FIELD

The invention relates to a device for regulating a random stream of voltage pulses for use at the input of an analog-to-digital converter, notably for an imaging system.

STATE OF THE PRIOR ART

An imaging system consists of a matrix of pixels which are sensitive to a range of electromagnetic radiation. A photoelectric detector and a microelectronic circuit are associated with each pixel.

A photoelectric detector, when it is subjected to an incident stream of photons of energy hv to which it is sensitive, generates electrical charges in proportion to the incident stream. The resulting current is then amplified and processed by the pixel's electronic circuit. The electronic circuit provides the signals required to reconstruct a visible image by measuring the energy of the photons received by the detector.

The two principal qualities of an imaging system must be considered: its spatial resolution and its energy resolution.

Spatial resolution depends on the dimension of the photoelectric detectors, which are assumed to be identical for all pixels, defining the size of the image's elementary point.

For its part, the energy resolution depends on the ability of the electronic circuits to measure the energy of all the photons received by the associated photoelectric detectors. It is understood, indeed, that a loss of energy of certain photons received may impair the resolution of the reconstructed image.

Although it is easy to control spatial resolution, increasing energy resolution is limited by the specifications of the electronic circuits and the constraints relating to them. Indeed, the electronic circuit of a pixel is subject to substantial technical constraints: above all it must have low consumption and high dynamics.

A block diagram of an assembly consisting of a photoelectric detector and a microelectronic circuit associated with a pixel is illustrated in FIG. 1. Photoelectric detector 1 receives incident photons ph and the electronic circuit consists of a preamplifier 2 measuring the signal delivered by detector 1, of a head amplification device 3 which processes the signal delivered by preamplifier 2, and an energy quantification circuit 4 which digitises the signals delivered by head amplification device 3 to obtain the energy histogram of the incident photons. The energy spectrum of the incident photons ph received can be obtained from this histogram.

An imaging system must be able to measure finely the energy of the incident photons arriving at a high rate. The current standard is a detection resolution of the order of 1% for an incident photon stream of the order of $10^7 \cdot s^{-1} \cdot mm^{-2}$.

To accomplish this, for each pixel, preamplifier 2, head amplification device 3 and converter 4 must have a high signal-to-noise ratio in order to limit as far as possible signal losses while the signal is routed from detector 1 to analog-digital converter 4.

The most efficient low-noise preamplifiers are those using a current integrator. FIG. 2 illustrates such an assembly associated with detector 1.

Detector 1 includes an element made from material M which is sensitive to the photon stream, and a resistor R connecting element M to a high voltage HT. The current integrator circuit includes a capacitor C1, an amplifier A1, a capacitor Cint and a resistor Rp. Capacitor C1 is installed at the non-inverting input of amplifier A1, and capacitor Cint and resistor Rp are installed in parallel between the inverting input and the output of amplifier A1.

Schematically, when a photon enters into material M with sufficient energy, it can interact and create electrical charges in the material, which charges are separated under the effect of the electrical field applied to the detector. Element M then generates a detection current i(t) over the time during which photon ph is detected. More specifically, a current pulse is generated for each photon ph which has interacted in the material.

Installed at the output of detector 1, preamplifier 2 receives current i(t) in the form of pulses, and produces in response voltage Vimp (t), in the form of pulses, given by:

$$Vimp(t) = -\frac{1}{Cint} \cdot \int i(t)dt = -\frac{Q}{Cint} \quad (1)$$

where Q is the quantity of charge produced by photon ph interacting with the semiconductor material.

Voltage Vimp(t) delivered by electronic circuit 2 is equal to the input voltage of head amplification device 3.

Head amplification device 3 enables the energy of the detected photons to be measured, i.e. the amplitude of the pulses obtained at the output of electronic circuit 2. It can include, for example, a band-pass filter at the output of electronic circuit 2 to optimise the signal-to-noise ratio, and a peak detector at the output of the band-pass filter, to measure the signal's maximum pulses.

Head amplification device 3 then delivers a voltage pulse E(t) the height of which is proportional to the pulse produced at the terminals of detector 1, i.e. to the energy transferred by photon ph to the detector material.

This voltage pulse E(t) is then digitised by quantification circuit 4, which is generally an analog-digital converter 4. The digital values obtained in this manner are provided to a computer which has been programmed to identify the energy values above a predetermined energy threshold.

At the output of head amplification device 3 the frequency of arrival of voltage pulses E(t) at the input of converter 4 is random.

And it is known that an analog-digital converter requires a conversion time which is equal to the input voltage processing time. More specifically, for each pulse E(t) received the converter will take a period φ to process the voltage of the pulse. It will then be said that the voltage of the pulse is processed during a conversion phase which is equal to the clock period of the converter. Over period φ of the conversion phase the converter is inoperative, and each pulse which arrives is not processed. The energy data of certain photons received by detector 1 is consequently lost in the electronic circuit: this consequently impairs the detection resolution of the pixel.

To estimate the data loss rate due to conversion time φ, it may be considered that the number of pulses E(t) received during a time interval t and arriving at the input of converter 4 obeys a Poisson law of parameter equal to λ (where λ is the average number of occurrences per time interval).

The probability that n pulses are received during time t is:

$$P_n(t) = e^{-\lambda t} \frac{(\lambda t)}{n!} \quad (2)$$

$$\text{Where} \sum_{n=0}^{\infty} P_n(t) = 1 \quad (3)$$

The probability of having at least one pulse in a time interval t is then:

$$\sum_{n=1}^{\infty} P_n(t) \approx 1 - P_0(t) \quad (4)$$

If a time interval $$t = \frac{1}{10\lambda}$$

is chosen, the probability of appearance of pulses E(t) in the interval is therefore:

$$1 - P_0(t) = 1 - e^{-0.1} \approx 0.095. \quad (5)$$

In other words, almost 10% of the pulses occur at a rate 10 times greater than average $\lambda$.

With an analog-digital converter 4 the conversion time of which is, for example, $$Ts = \frac{1}{10\lambda},,$$

the data loss rate at the output of analog-digital converter 4 is nearly 10%. This means that 10% of the information required to reconstruct a visible image is lost.

If an ideal case is considered, in which output stream μ of the converter is constant, analog-digital converter 4 operates at a rate equal to approximately 100 times average value $\lambda$ of the stream to obtain a loss rate of the order of 1%. And this would consist in increasing the dynamics and the conversion speed of analog-digital converter 4. Such an increase of the capacities of the analog-digital converter would cause a substantial increase of its consumption, and hence of the consumption of the electronics associated with each pixel. At a scale of a matrix of several thousand pixels, such an increase of consumption would be particularly significant.

The following problem therefore arises: current imaging systems have too high a loss rate which due to the limited capacity for processing the random stream of pulses by the analog-digital converters associated with the pixels. Such imaging systems are not therefore suitable for certain applications, notably medical applications, which require a high detection resolution.

The obvious solution, which would consist in increasing the capacities of the analog-digital converter, is not adequate in terms of overall performance of the matrix of pixels.

The goal of the present invention is consequently to propose a device coupled with an analog-digital converter which enables the data loss rate at the output of the converter to be reduced without having to increase the performance of this converter.

A secondary aim of the present invention is to propose an imaging system consisting of a matrix of pixels with a high detection resolution.

DESCRIPTION OF THE INVENTION

The present invention is defined by a device for converting a random stream of voltage pulses into a regulated stream of digital data, characterised in that it includes a stream regulation device and an analog-digital converter at the output of the said stream regulation device, where the said converter undertakes an analog-digital conversion at a conversion frequency, where the said stream regulation device includes a buffer memory of capacity K, where K is an integer and K≥1, in which the voltage signal for each received pulse is stored, and where reading of the said buffer memory is regulated at the said conversion frequency.

The regulation device includes:
  an amplitude detection unit which receives the said pulses at input, and which produces for each pulse received an analog signal the amplitude of which is proportional to the maximum amplitude of the said pulse, and where the said analog signal is supplied to the said buffer memory;
  a pulse detection unit which receives the said pulses at input, and which produces at output a first binary signal which changes to a high level during the pulse detection time, where the said first binary signal is sent to control means in order to write in the buffer memory.

The said buffer memory of capacity K preferentially consists of K analog memory cells, where the said memory cells are put in parallel when K>1.

Each memory cell includes:
  a first switch and a second switch in series between an input and an output of the said memory cell, where the said first switch is connected to the output of the amplitude detection unit, and the said second switch is connected to the input of the said converter;
  a condensator positioned between a node common to both switches and a reference potential.

The buffer memory also includes control means to change the said first switch to the on state when the said first binary signal changes to a high level, and to change the said second switch to the on state when a second binary signal at the conversion frequency changes to a high level.

The invention also relates to a photoelectric detector and an electronic circuit associated with a pixel, where the said photoelectric detector is able to receive incident photons, and to emit current pulses at output, where the said electronic circuit includes an integrated circuit including a first condensator and a first resistor, placed in parallel between the output and the inverter input of an operational amplifier, where the said inverter input of the said operational amplifier receives the said current pulses, where the said integrator circuit emits voltage pulses at output, where the said electronic circuit is characterised in that it also includes a conversion device as defined above, which receives at input the output of the said integrator circuit, and which emits at output a regulated digital signal at the said conversion frequency.

BRIEF DESCRIPTION OF THE ILLUSTRATIONS

Other characteristics and advantages of the invention will appear on reading a preferential embodiment of the invention, made in reference to the attached figures, among which:

FIGS. 7a and 7b illustrate the configurations of the logical means enabling characteristic indicators to be obtained of the buffer memory of the conversion device according to a preferred embodiment of the invention;

DETAILED DESCRIPTION OF PARTICULAR EMBODIMENTS

Figure 3:
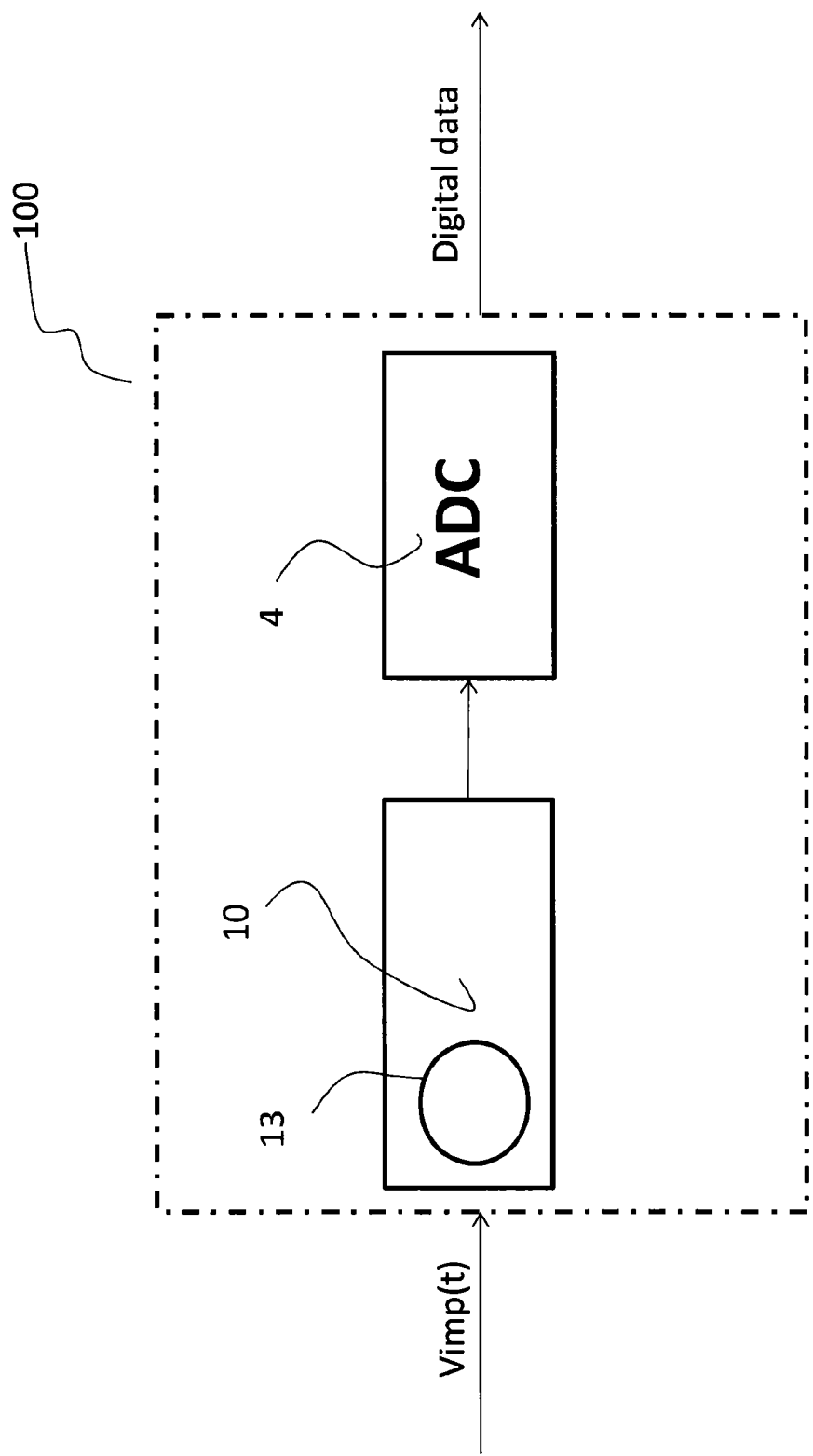
FIG. 3 illustrates schematically the device for converting a random stream of voltage pulses (Vimp) into a regulated stream of digital data according to the invention.

FIG. 3 illustrates a diagram of the device for converting a random stream of voltage pulses into a regulated stream of digital data according to the invention.

More specifically, conversion device 100 includes a regulation device 10 and an analog-digital converter 4 positioned at the output of the regulation device. Analog-digital converter 4 has a conversion time $\phi$ of less than or equal to period Tck of its clock signal. Conversion device 100 receives the voltage pulses in the form of signal Vimp(t).

Regulation device 10 includes a buffer memory 13 of capacity K, where K is an integer greater than or equal to 1, in which the voltage signal of each pulse received is stored. Bearing in mind that the pulses arrive randomly, it is understood that writing in the buffer memory also occurs in a random fashion.

The voltage signal stored in buffer memory 13 is read in an asynchronous manner relative to the manner of writing. Indeed, the reading of the buffer memory is regulated at a frequency identical to that of the clock signal of converter 4.

Thus, at the output of regulation device 10 everything occurs as if the appearance of each pulse of the random stream of pulses had been aligned with the start of a conversion phase of analog-digital converter 4. Regulation device 10 therefore acts as an analog queue.

To illustrate the advantages procured by the invention, reference will be made below to the mathematical theory of queues. Indeed, the buffer memory of the regulation device can be considered as a queue of the M/G/1/K type, using Kendall's notation. Reference may be made to the following article: "M/G/c/K blocking probability models and system performance", J. MacGregor Smith, Performance Evaluation 52 (2003) 237-267.

In a non-restrictive manner, and in order to simplify the calculations, it will be considered that the conversion time of converter 4 is constant, and therefore necessarily deterministic, and that the input stream of the pulses is a Poisson stream.

Conversion device 100 receives an input stream, noted $\lambda$, which is equal to an average number of arrivals of pulses for a given time interval.

Conversion device 4 processes a set of data, and generates an output stream, noted $\mu$, which is simply the output stream of the converter.

Conversion device 100 therefore provides traffic $$\rho = \frac{\lambda}{\mu}$$

equal to the input stream during the average service time.

Probability $P_k$ of blockage is given by the following formula:

$$P_k = \frac{\rho^{(2-\sqrt{\rho}+2K)/(2-\sqrt{\rho})}(-1+\rho)}{\rho^{(2(2-\sqrt{\rho}+K)/(2-\sqrt{\rho}))}-1} \quad (6)$$

where K is the capacity of buffer memory 13.

The probability of blockage Pk of the conversion device is equal to the probability that the data cannot be processed during conversion time $\phi$. This is therefore the loss rate.

Figure 4:
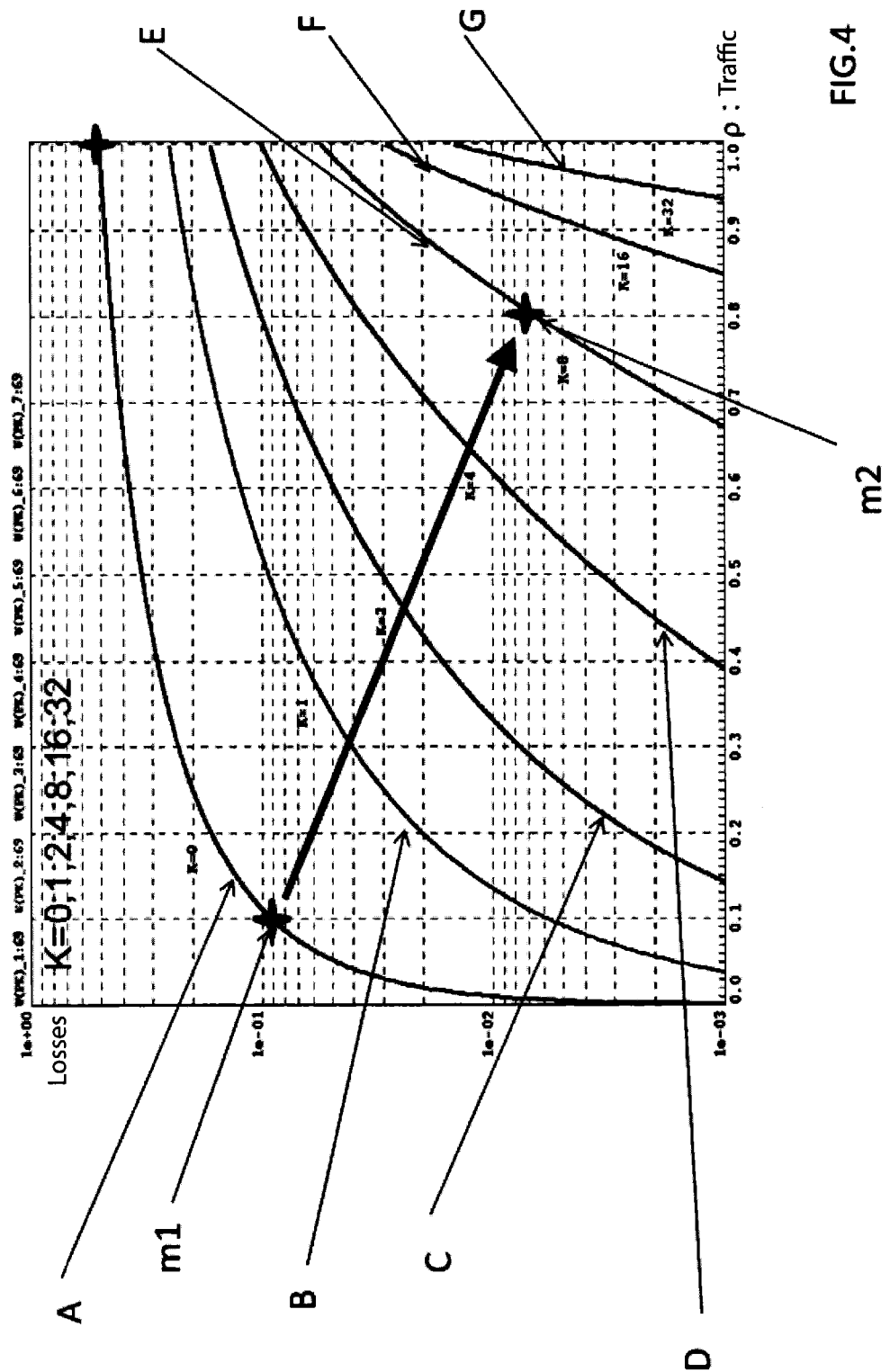
FIG. 4 represents curves representative of the loss rate of the conversion device represented in FIG. 3, plotted for different characteristic parameters.

FIG. 4 illustrates loss rate $P_k$ as a function of traffic $\rho$ for different values of K and for a fixed value of $\lambda$.

Curve A gives loss rate $P_k$ when K=0, i.e. the loss rate of the analog-digital converter alone.

It will be observed by comparing curve A (K=0) and curve B (K=1) that the regulation implemented by the analog queue leads to a reduction of the standard deviation of stream $\mu$.

It will be noted that the standard deviation of stream $\mu$ is lower the higher capacity K of the buffer memory, cf. curves C (K=2), D (K=4), E (K=8), F (K=16) and G (K=32). A very high value of K would enable an output rate $\mu$ to be obtained which is approximately equal to that of the input stream (of average value $\lambda$), with a loss rate close to zero.

Thus, if curve A is compared with curve E, for example, it is observed that at value m1 of curve A, $$\rho = 0, 1, \frac{1}{\mu} = 10 \text{ ns}$$

and the losses are of the order of 10%. At value m2 of curve E, $$\rho = 0, 8, \frac{1}{\mu} = 80 \text{ ns}$$

and the losses are of the order of 0.7%.

Consequently, between curve E and curve A, the losses are divided by a factor of 13 and $\mu$ is divided by a factor of 8. From this it is concluded that it is possible to reduce the technical constraints and the loss rate of the analog-digital converter by increasing capacity K of the buffer memory.

A sufficiently high value of K will advantageously be chosen to obtain an adequate compromise between the desired loss rate reduction, the necessary performance of analog-digital converter 4 and the size of the queue. K≥1 will be taken, and preferably K=$2^l$ with l≥1.

Figure 5:
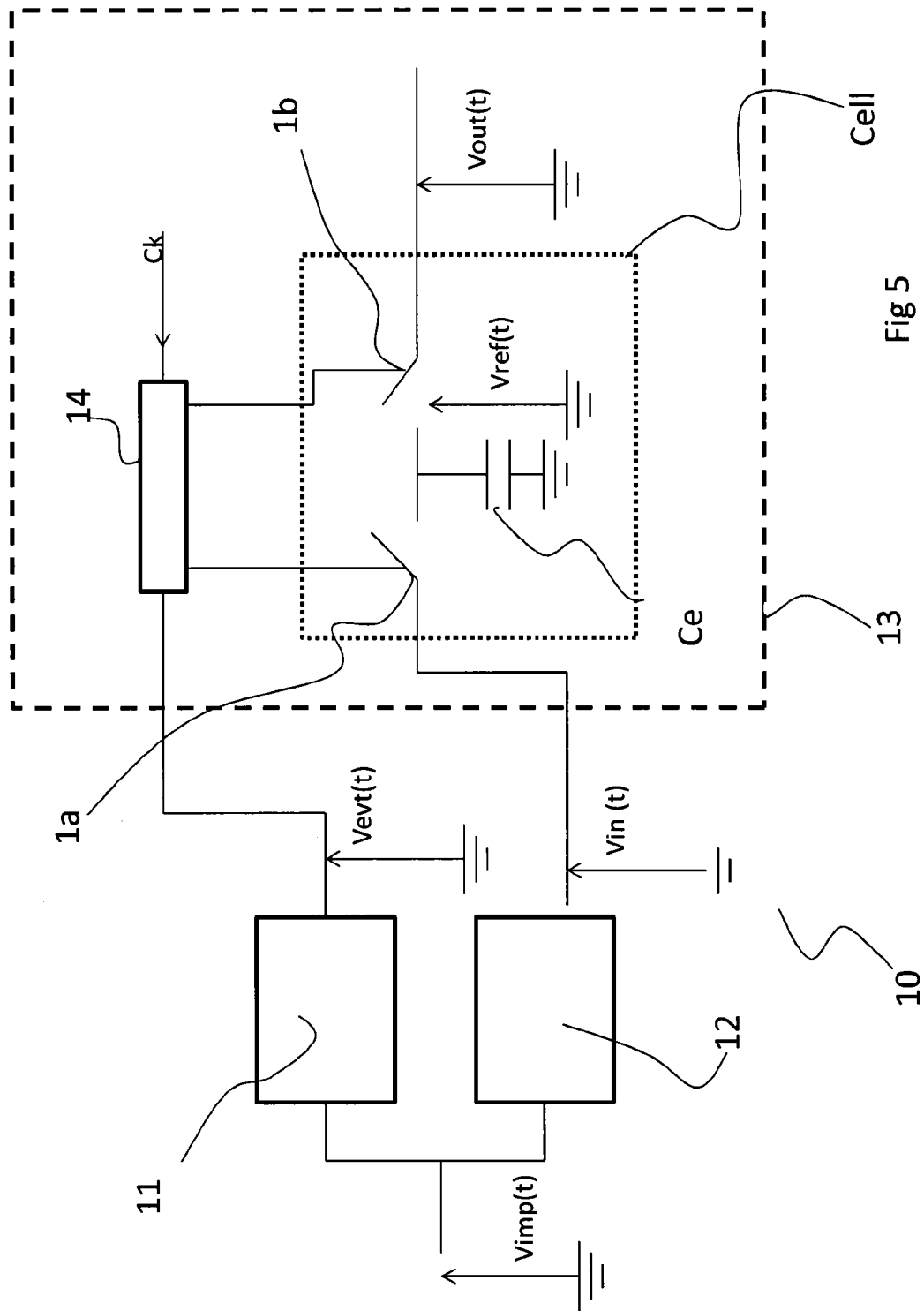
FIG. 5 illustrates a diagram of the conversion device according to a preferred embodiment of the invention.

FIG. 5 illustrates a diagram of the conversion device according to a preferred embodiment of the invention.

More specifically, device for regulating the random stream of pulses 10 according to the invention includes a pulse detector 11, a maximum amplitude detector 12 and a buffer memory 13.

Pulse detector 11 and maximum amplitude detector 12 both receive signal Vimp(t).

Pulse detector 11 provides a binary signal Vevt(t) which can be used by a digital circuit. More specifically, for each voltage pulse Vimp(t) received at the input of pulse detector 11, signal Vevt(t) changes to a high level over the period of the pulse. When pulse detector 11 does not detect any pulse, binary signal Vevt(t) at the output of pulse detector 11 remains at a low level. Pulse detector 11 can, for example, be produced by means of a comparator circuit, or of a differentiating circuit, which can easily be produced by those skilled in the art.

Maximum amplitude detector 12 measures the maximum amplitude of voltage pulses Vimp (t) which it receives. For each pulse Vimp(t) received, it delivers an analog signal Vin(t) the height of which is proportional to the maximum amplitude of the pulse received. Signal Vin(t) can consequently be compared to the sampling of voltage Vimp(t), which is synchronous with signal Vevt(t). Maximum amplitude detector 12 can be produced, for example, by means of a peak detector circuit, implementation of which is known to those skilled in the art.

Buffer memory 13 of capacity K consists of K memory cells Cell arranged in parallel. In FIG. 5 only a single memory cell has been represented. Each of memory cells Cell includes a first switch 1a and a second switch 1b in series between the input and the output of memory cell Cell, and a condensator Ce positioned between the common node of both switches and a first potential of reference Vref(t).

First switch 1a, or write switch, is connected to the output of maximum amplitude detector 12, and second switch 1b, or read switch, is intended to be connected to the input of an analog-digital converter 4.

The output voltage of memory cell Cell is noted Vout(t).

Control means 14 enable the opening and the closure of first switch 1a relative to the opening and closure of second switch 1b to be controlled asynchronously. Changing of first switch 1a to the on or off state depends on whether binary signal Vevt(t) derived from pulse detector 11 is at a high or low logical level, whereas changing of second switch to the on or off state depends on the logical state of a binary signal Ck derived from the converter's clock signal, or derived from a signal in phase with the converter's clock signal.

Clearly, it is stipulated that first switch 1a and second switch 1b cannot both be in the on state at the same time.

When write switch 1a of the memory cell is in the on state, i.e. when a pulse is detected, and over the period of the detected pulse memory cell Cell receives voltage Vin(t). The electrical signal corresponding to the detected pulse is then transferred to capacitor Ce which is being charged: control means 14 write in memory cell Cell.

When read switch 1b of the memory cell is in the on state, i.e. when the clock signal is at a high level, and over a period Tck capacitor Ce is being discharged and transmits signal Vout(t). The latter is a sample of signal Vimp(t) which is delayed relative to signal Vin(t). Memory cell Cell is then read.

It will be understood that the stream of pulses arriving randomly in the form of signal Vimp(t) is regulated by the device according to the invention to supply a signal Vout(t) formed of regulated samples.

One advantage of arranging K stages in parallel, where each stage includes an elementary memory cell, is that it prevents a deterioration of the signal, since there is no transfer of charge between the memory cells.

Figure 6:
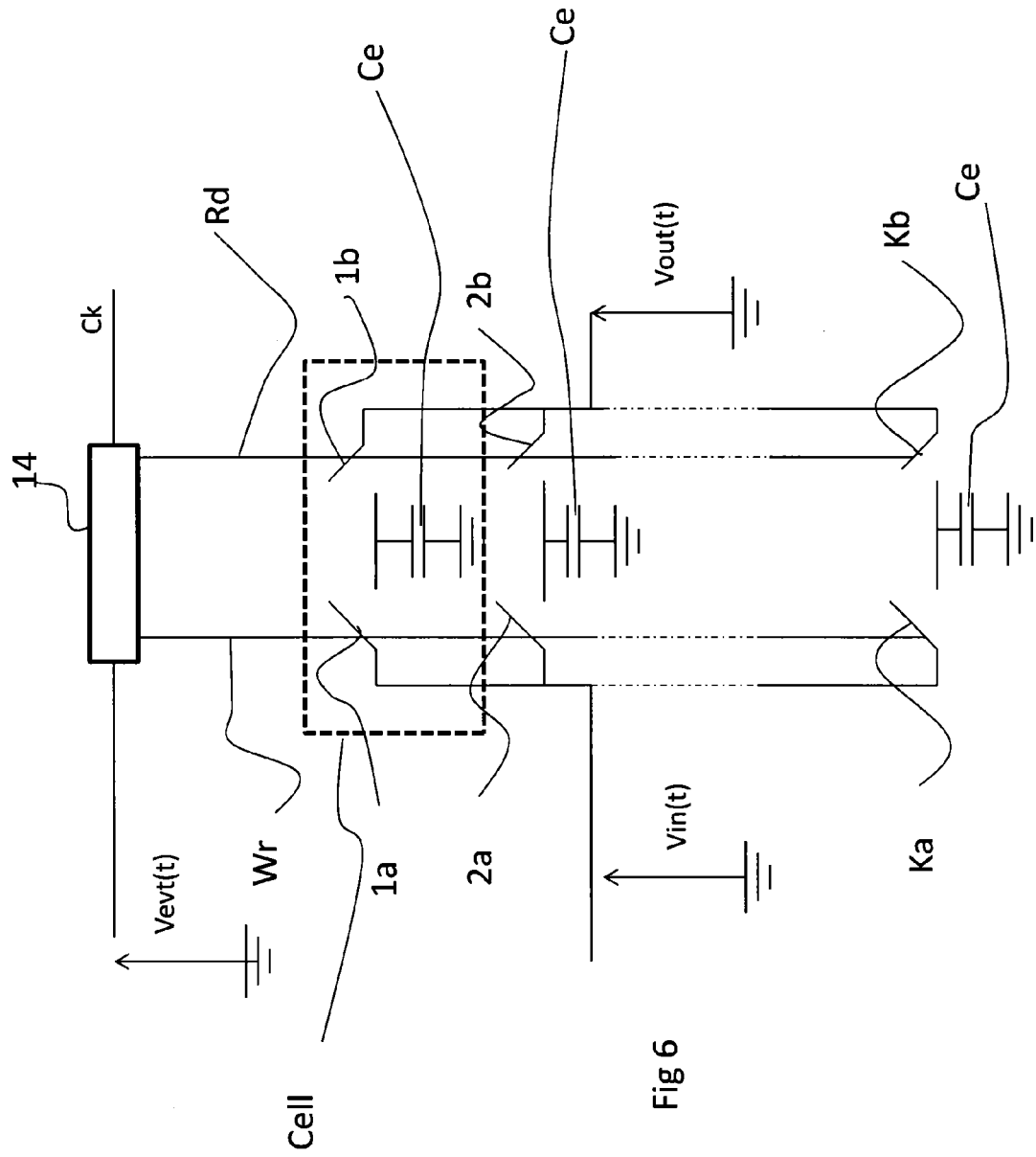
FIG. 6 illustrates a close-up view of FIG. 5.

FIG. 6 illustrates a close-up of buffer memory 13 represented in FIG. 5.

The different memory cells of the buffer memory are identical. The value of capacitor Ce and the technical specifications of write switches 1a, 2a, . . . , Ka and of read switches 1b, 2b, . . . , Kb are thus the same for each of the memory cells.

Control means 14 receive at input binary signal Vevt(t) and clock signal Ck. At output, control means 14 supply firstly write signal Wr enabling the K write switches to changed to the on state, and secondly read signal Rd enabling the K read switches to be changed to the on state.

Control means 14 act as a FIFO (First In, First Out) stack for managing the pulses.

Indeed, a binary occupation indicator J(k), which indicates whether the memory cell is "free" or "occupied", is associated with each memory cell k, where k=1, . . . , K. It is said that a cell k is "occupied" when the signal contained in its condensator Ce has not been read, i.e. when no read signal Rd(k) has been sent by control means 14 to read switch kb of memory cell k to change it to the on state.

When a memory cell k of buffer memory 13 is "occupied" its binary occupation indicator $J^{(k)}$ is equal to 1, and equal to 0 when it is "free".

Reading an occupied cell causes the binary occupation indicator to be set to 0.

When a pulse is detected by pulse detector 11 signal Vevt(t) changes to a high level over the period of the pulse. Binary occupation indicator J(k) of first free memory cell k (with k=1, K; where K is a positive integer), of the buffer memory changes to 1: cell memory k is therefore occupied. At the same time, control means 14 send a write signal Wr(k) to write switch ka of cell memory k to change it to the on state, in order to write in it.

Writing then occurs in capacitor Ce of cell memory k over period θ of the pulse during which write switch ka is in the on state. The write switches of the other memory cells are then open over period θ.

Each relative electrical signal can be written only in a single memory cell, since two write switches 1a, 2a, . . . , Ka cannot be in the on state at the same time.

The read switches are controlled periodically and the control is implemented by a generator of K non-overlapping phases.

K will advantageously be a multiple of 2, and preferably a power of 2, in order to facilitate the establishment of a binary logic in control means 14. In the remainder of the description it will be considered that K is a power of 2.

More specifically, the generator consists of a modulo binary counter K regulated by a clock signal of period Tck which delivers a binary word of N bits of value $2^N$.

The counter is advantageously synchronous, since the device according to the invention is intended for operation at high frequency.

The clock of period Tck is preferably the converter's clock. In the remainder of the description it will be considered that the clock signal derives from the analog-digital converter.

At the output of the counter an N to K decoder converts binary word $2^N$ into K phases phi(1), . . . , phi(K) of period Tck. Each phase corresponds to a read phase specific to a memory cell. Period Tck is therefore equal to the time during which a read switch 1b, 2b, . . . , Kb of a memory cell is in the on state during the reading of the cell.

Lastly, toggles of the RS type provide non-overlapping of the K phases phi(1), . . . , phi(K) to prevent simultaneous conduction of two read switches 1b, 2b, . . . , Kb.

Phases phi(1), . . . , phi(K) and the cells' binary occupation indicators J(1), . . . , J(K) are the inputs of a logical AND gate, the output of which is a read signal Rd(1), . . . , Rd(K). In the case of memory cell k read signal Rd(k) is therefore defined by (k)=phi(k). J(k).

Thus, if memory cell k is read during corresponding read phase hi(k), the following relation applies: Rd(k)=phi(k). J(k)=1. J(k).

Consequently, if cell k is "occupied", Rd(k)=1.

The read thus occurs with the discharge of capacitor Ce of memory cell k over a period Tck during which control means 14 send a read signal Rd(k) to read switch kb to change it to the on state, while the other write switches are open.

In the next read phase, phi(k+1) binary occupation indicator J(k) of cell k is set to 0. Cell k is therefore free.

Conversely, if cell k is free: Rd(k)=phi(k). J(k)=1. J(k)=0. No read signal is thus sent to read switch kb.

Since, for a given cell, write switches 1a, 2a, . . . , Ka and read switches 1b, 2b, . . . , Kb cannot be in the on state at the same time, it is clearly understood that the reading is offset from the writing for a given cell. Write period θ is small compared to read time Tck. The fill rate of memory capacitor of value C by the downstream circuit of output resistance R is equal to 1−exp(−t/RC). A write period t=5RC typically gives a charge of over 99%. For example, with C=0.2 pF and R=1 kΩ, t=1 ns is obtained.

Control means 14 are preferentially configured to initiate writing in a predetermined cell, as soon as this cell is free. In the remainder of the description it will be considered that this cell is first cell 1.

To do so, control means 14 advantageously include means to initiate writing in the first cell.

Indicators AJ and JM1 can thus be created through the use of logical means.

FIGS. 7a and 7b illustrate respective logical means 15, 16 enabling indicators AJ and JM1 to be obtained.

Indicator AJ is supplied by a logical OR gate 15 which receives at input the binary occupation indicators of the K memory cells.

When AJ=0 no memory cell contains a signal. All the cells are free. Conversely, when, AJ=1 the buffer memory includes one or more cells to be read.

Indicator JM1 is supplied by a logic gate 16 which consists of a logical OR gate 16a and of a logical inverter gate 16b. Logical OR gate 16a receives at input the binary occupation indicator of the last cell J(k) and the inverse signal of AJ, noted notAJ. Signal notAJ is supplied by logical inverter gate 16b which receives signal AJ at input.

When all the cells of the buffer memory are free (notAJ=1), or when last cell K is occupied J(k)=1, indicator JM1=1. In this case, control means 14 firstly write the electrical signal corresponding to the next pulse detected in the first memory cell.

Control means 14 can include other indicators enabling the operation and working load of buffer memory 13 to be monitored. Other indicators can thus be put in place to measure the occupation rate of buffer memory 13.

A means of resetting control means 14 to zero can advantageously be provided. When it is activated this zero reset means can then transmit a zero reset signal to control means 14, to reset them.

Figure 8:
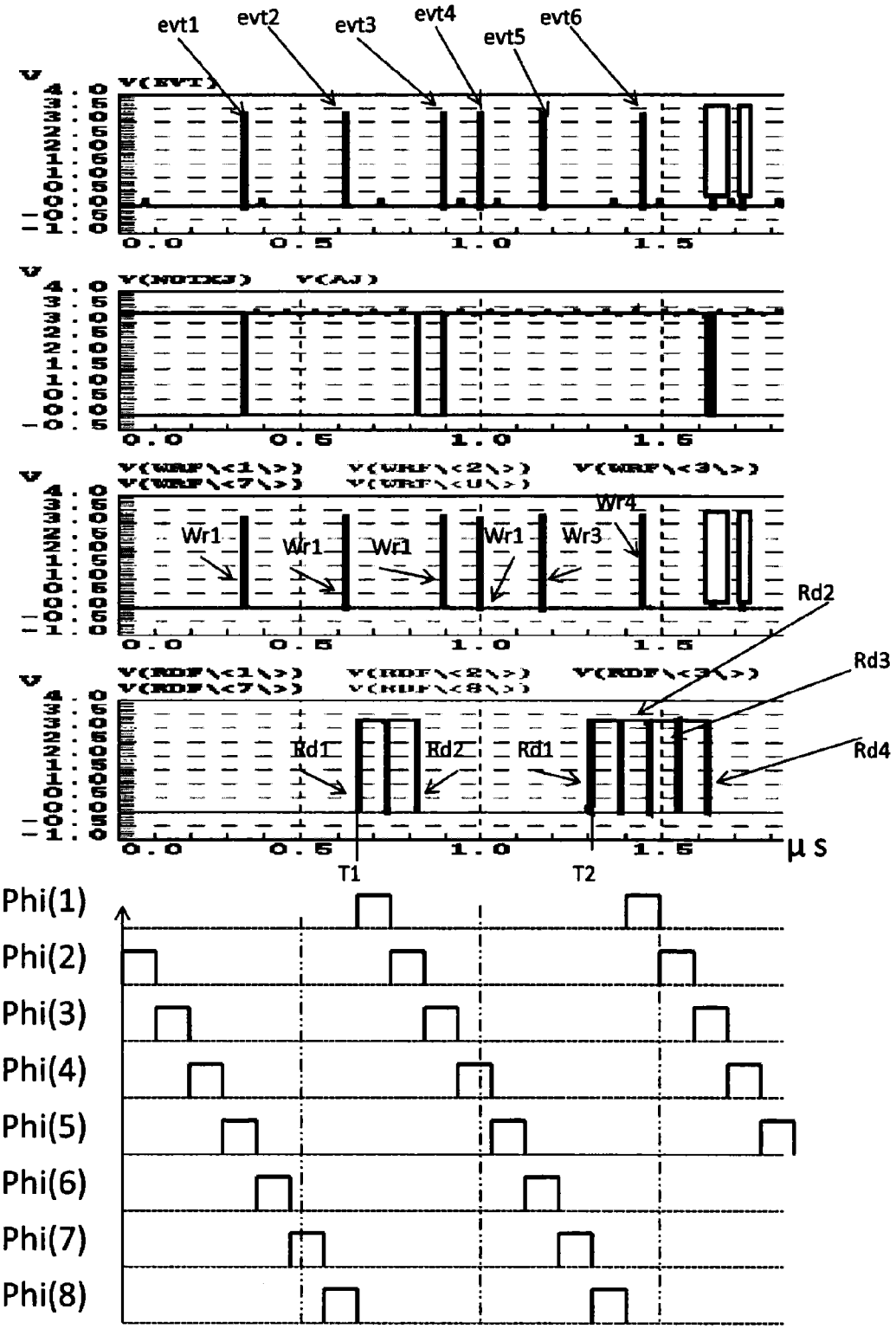
FIG. 8 illustrates a timing diagram of the characteristic signals at the input and at the output of the means for controlling the buffer memory of the conversion device according to a preferred embodiment of the invention.

FIG. 8 represents a timing diagram for the simulation of the characteristic signals of control means 14 for a buffer memory of capacity equal to eight. The value K=8 is a satisfactory compromise between the performance of regulation device 10 and the number of memory cells Cell used. A value of K less than or greater than 8 can of course be chosen, and the explanations given here as an example for K=8 remain valid.

The characteristic signals are firstly signal Vevt(t) and read phases phi (1), . . . , phi(8), and secondly the output signals of control means 14, which are the signal relative to indicator AJ and write signals Wr(1), . . . Wr(8) and read signals Rd(1), . . . Rd(8)

Before the pulses arrive the device is reset to zero by means of the zero reset command of control means 14. It is therefore in an initial state in which all the memory cells are free.

Indicator AJ is at zero before the first event, evt1, arrives: AJ=0 and therefore JM=1. Control means 14 therefore write in memory cell 1.

On detection of the first pulse signal Vevt(t) changes to a high level, represented by peak evt1 in FIG. 8. The binary occupation indicator changes to 1, J(1)=1, and a corresponding write signal Wr(1) is sent by control means 14 to switch 1a to change it to the on state over the period of the first pulse.

As long as cell 1 is occupied, i.e. as long as it is not read, control means 14 will generate a binary occupation indicator for free memory cell 2 for the next detected pulse. In our example, on detection of the second pulse, signal Vevt(t) changes to a high level, represented by peak evt2: control means 14 create a binary occupation indicator J(2)=1 and send a write signal Wr(2) to write switch 2a of cell 2 to change it to the on state.

In the case of both these detected pulses, peaks evt1 and evt2, only two binary occupation indicators are created. The other binary occupation indicators are therefore zero. No corresponding write signal is consequently sent to cells 3, 4, 5, 6, 7, 8.

In our example period Tck is 80 ns. Reading is therefore regulated with a period of 80 ns.

At peak evt1, the read phase is that of cell 5, as shown by the curve indicative of the state of phase phi(5). The read signal is therefore Rd(5)=phi(5). J(5)=0 since memory cell 5 is free. No signal is therefore sent to the read switch of cell 5. In a similar manner, signals Rd(6), Rd(7), Rd(8) are zero.

At time T1, after the reception time of the second pulse, evt2, the read phase is that of cell 1, as shown by the curve indicative of the state of phase phi(1). In this case Rd(1)=Phi(1). J(1)=1. A read signal is therefore sent to read switch 1b of the first memory cell, and memory cell 1 is "read".

In the next read phase, i.e. Phi(2), Rd(2)=1 and binary occupation indicator J(1) of cell 1 is set to 0. Similarly, in read phase Phi(3) binary occupation indicator J(2) of memory cell 2 is set to 0.

When the third pulse is detected signal Vevt(t) changes to a high level, represented by peak evt3. At this instant all the cells are free. Indicator AJ is therefore zero, as shown by the curve representative of signal AJ. Indicator JM1 is consequently equal to 1. Control means 14 will therefore "write" the electrical signal corresponding to the next pulse in memory cell 1.

Consequently, in response to peak evt 3, control means 14 generate a binary occupation indicator J(1)=1 and send a write signal Wr(1) to cell 1 to change switch 1a to the on state. The pulses corresponding to peaks evt4, evt5, evt6, are written respectively in memory cells 2, 3, 4.

Thus, on detection of the fourth pulse, peak evt4, a binary occupation indicator J(2)=1 is generated and a corresponding write signal Wr(2) is sent to cell 2 on detection of the fifth pulse, peak evt5, a binary occupation indicator J(3)=1 is created and a corresponding write signal Wr(5) is sent to cell 3, and on detection of the sixth pulse, peak evt6, a binary occupation indicator J(4)=1 is generated and a corresponding write signal Wr(4) is sent to cell 4.

For these pulses, only 4 binary occupation indicators are created. The other binary occupation indicators J(5), ..., J(8) are therefore zero. No corresponding write signal is sent to cells 5, 6, 7, 8.

At the instant of reception of the third pulse, peak evt3, the read phase is that of memory cell 3, as shown by the curve indicative of the logical state of phase Phi(3) The read signal is therefore Rd(3)=0 since memory cell 3 is free at this instant. In a similar manner, signals a Rd(4), Rd(5), Rd(6), Rd(7), Rd(8) are zero.

On return of the read cycle to cell 1, i.e. at time T2, Rd(1)=Phi(1). J(1)=1. A read signal is therefore sent to the read switch of the first cell. In the next read phase, i.e. Phi(2) Rd(2)=1 and binary occupation indicator of cell 1 is set to 0. Similarly, in read phase Phi(3), Rd(3)=1 and the binary occupation indicator of cell 2 is set to 0, and in read phase Phi(4), Rd(4)=1 and the binary occupation indicator of cell 3 is set to 0.

The binary occupation indicator of cell 4 is reset to zero in read phase Phi(5).

When read phase Phi(4), is finished, AJ=0. Consequently, on reception of the next pulse, control means 14 will write firstly in cell 1.

Indicator JM1 is used if cell 8 is occupied, i.e. J(8)=1. In this case, indicator JM1 is equal to 1 and control means 14 firstly write the electrical signal corresponding to the next pulse in cell 1.

Conversion device 100, as illustrated in FIG. 5, can be produced using discrete electronics with commercially available components.

The regulation device according to the invention can be integrated, and is suitable for microelectronic integration using CMOS technology. Such an embodiment has the advantage that it is inexpensive, and enables remarkable characteristics to be obtained, particularly in terms of power consumption.

The switches are preferably MOSFET transistors, and in this case the increase of the value of capacitor Ce enables the recharge noise (called the kT/C noise) to be reduced.

Implantation using ordinary 0.13 µm CMOS technology will preferentially be chosen. The device may be produced in the form of a specific circuit or ASIC (Application Specific Integrated Circuit).

The regulation device satisfies the following constraints:
low sensitivity to technological variations in order to limit dispersions from one circuit to another;
low sensitivity to environmental variations;
low noise;
high dynamics;
low power consumption.

The assessed encumbrance of regulation device 10 using 0.13 µm CMOS technology is 800 µm$^2$. When this encumbrance is compared to that of an 8-bit 12.5 MHz analog-digital converter, produced using the same technology, estimated at 200×400 µm$^2$=80000 µm$^2$, it is observed that proposed regulation device 10 occupies 1% of the area of the converter, and enables the "(speed×losses) product" constraint to be divided by 100 if K=8.

Conversion device 100 described above can be integrated in the electronic circuit associated with a pixel.

Figure 9:
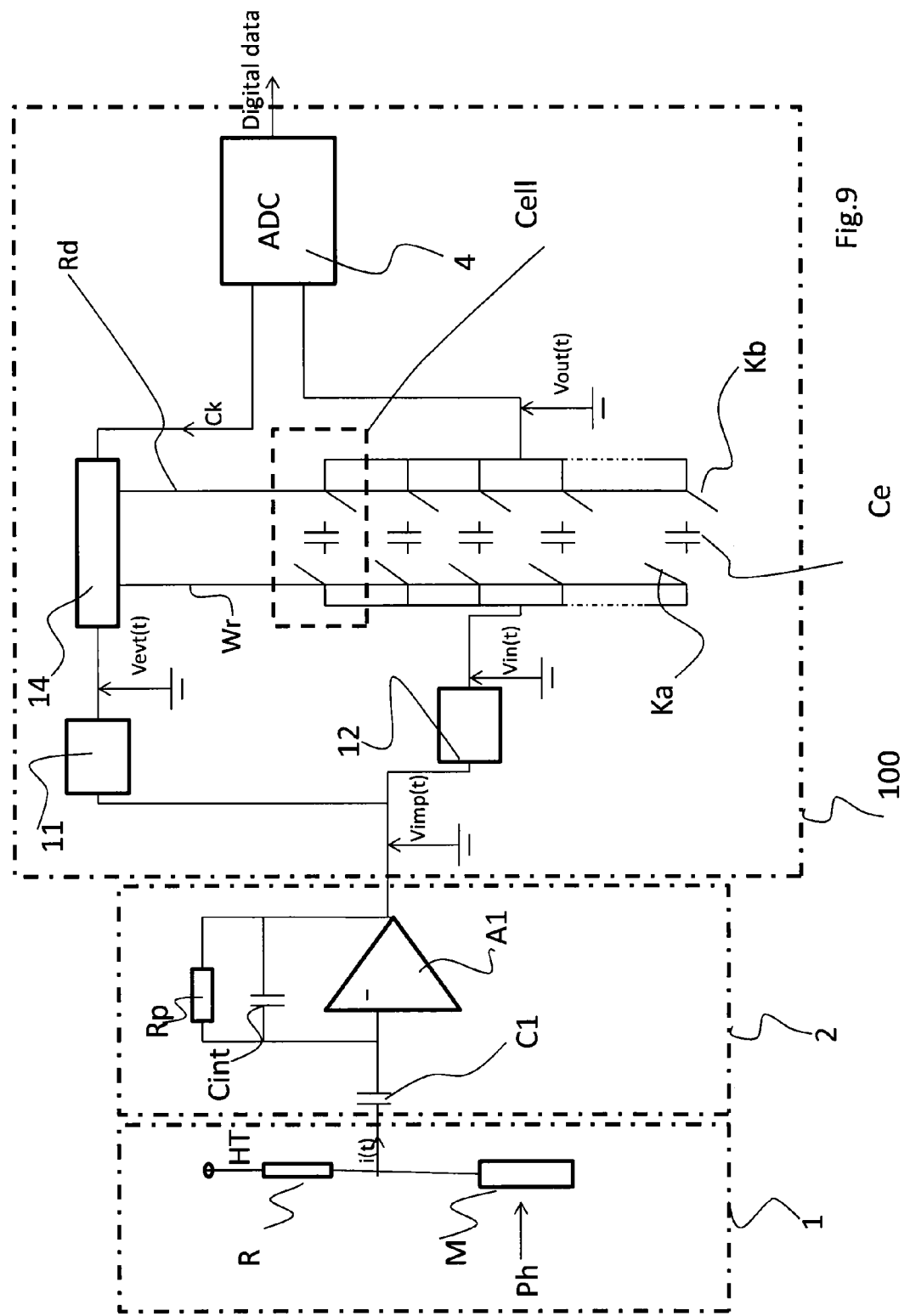
FIG. 9 illustrates a block diagram of an assembly consisting of a photoelectric detector and a microelectronic circuit associated with a pixel, when the microelectronic circuit includes the conversion device according to a preferred embodiment of the invention.

More specifically, FIG. 9 illustrates a block diagram of a photoelectric detector and an electronic circuit associated with a pixel, when the electronic circuit includes conversion device 100 produced according to the preferred embodiment of the invention.

Figure 1:
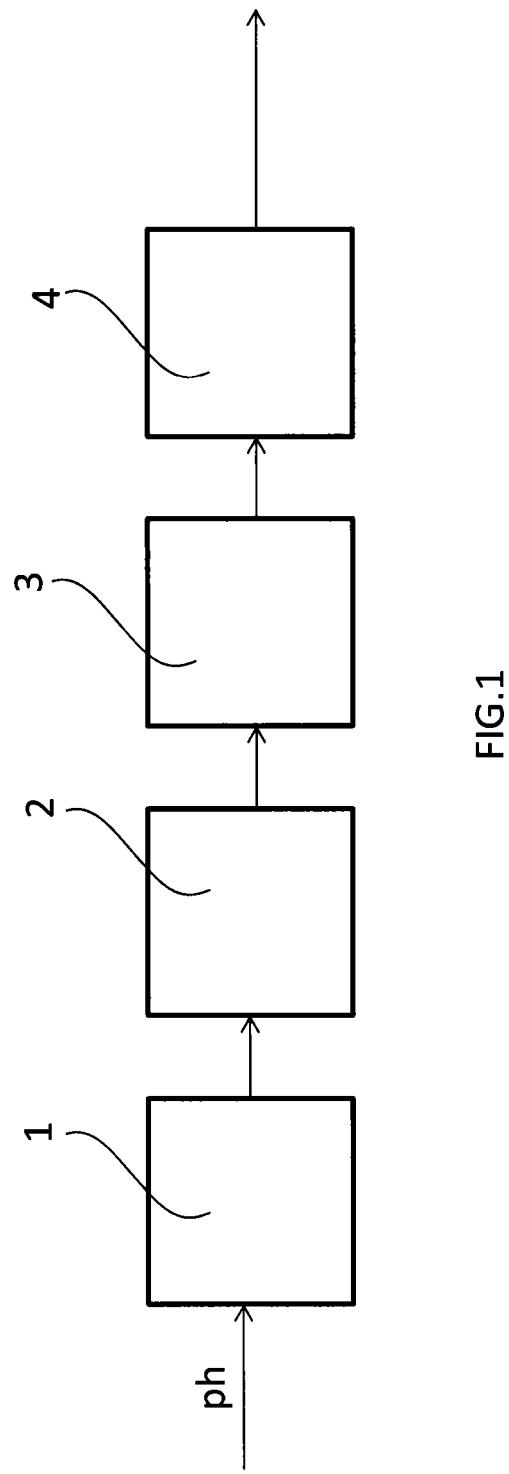
FIG. 1 illustrates a block diagram of an assembly consisting of a photoelectric detector and a microelectronic circuit associated with a pixel, of the state of the art.
Figure 2:
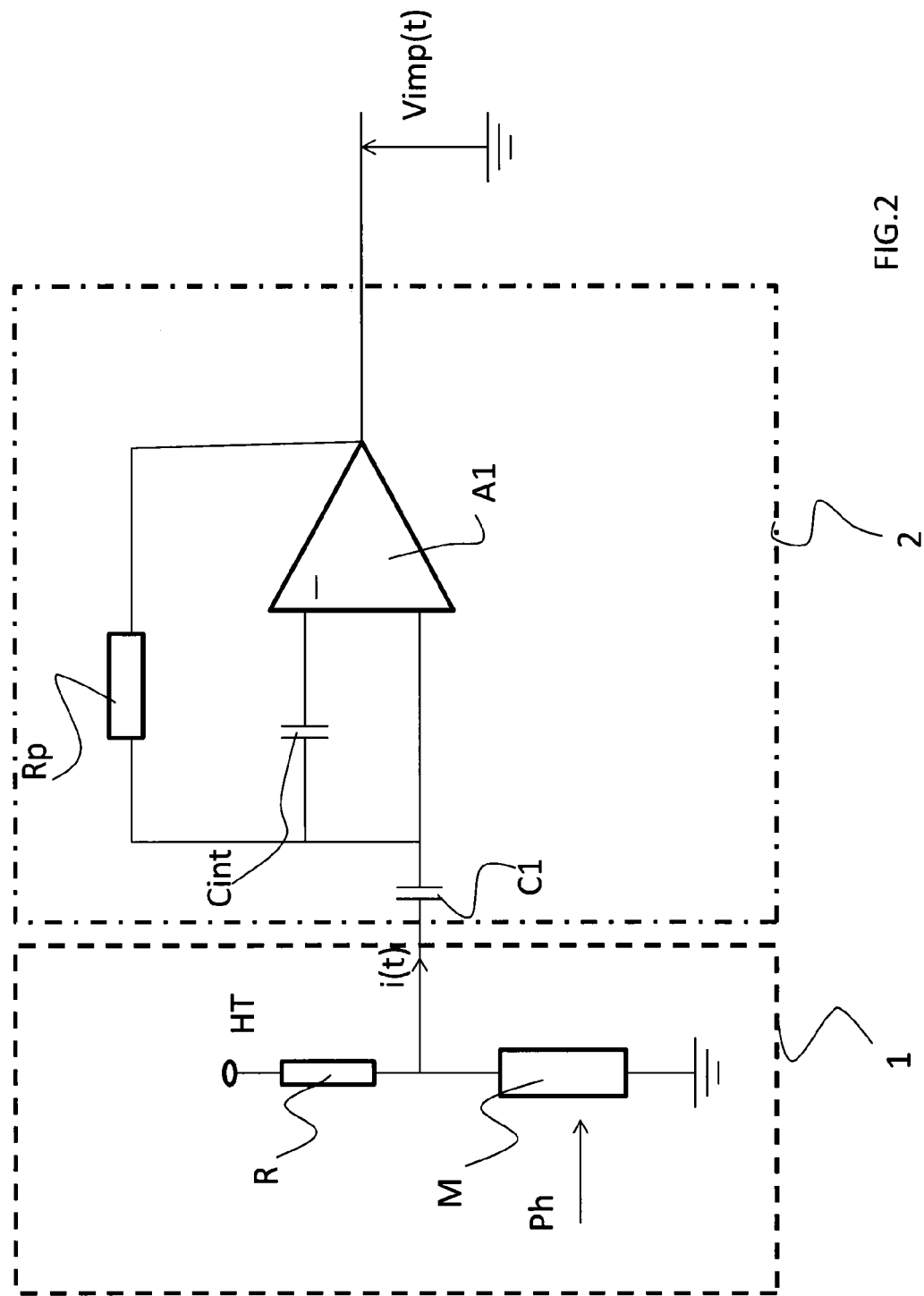
FIG. 2 illustrates the assembly of a preamplifier, associated with a photoelectric detector, in the pixel of FIG. 1.

Detector 1 is as described above in relation with FIG. 2. Detector 1 advantageously includes a photoelectric element made of a semiconductor material M, such as CdZnTe, or CdTe:Cl, or again CdTe:In, and a resistor R connecting it to a high-voltage source HT. The output of the detector is connected to a preamplifier 2 supplying a voltage Vimp(t) in response to the current pulses i(t) delivered by the detector.

A conversion device 100 according to the invention is positioned at the output of preamplifier 2. It receives voltage Vimp(t) at input. A clock signal Ck derived from converter 4 is sent to control means 14 of device 100 for regulating a random succession of voltage pulses in order to control the read switch or switches of the device using read signal Rd.

Implanting conversion device 100 in the microelectronic circuit associated with the pixel enables the detection resolution of an imaging system comprising a matrix of pixels to be increased, whilst using less fast analog-digital converters.

Such an imaging system will find applications when the stream is random. It can be used in particular in the medical field.

The invention claimed is:
1. A device, comprising:
a photoelectric detector and an electronic circuit associated with a pixel, the photoelectric detector to receive incident photons and to emit current pulses at output, wherein
the electronic circuit includes an integrated circuit including a first condensator and a first resistor, placed in parallel between output and inverter input of an operational amplifier,
the inverter input of the operational amplifier receives the current pulses,
the integrator circuit emits voltage pulses at output,
the electronic circuit includes a conversion device which receives at input output of the integrator circuit, and which emits at output a regulated digital signal at a conversion frequency, and
the conversion device includes
a stream regulation device, and
an analog-digital converter at output of the stream regulation device, wherein
the converter undertakes an analog-digital conversion at the conversion frequency,
the stream regulation device includes a buffer memory consisting of K analog memory cells, where K is an integer and K≥1, in which voltage signal for each received pulse is stored, in a write phase, reading of the buffer memory being regulated at the conversion frequency and undertaken in an asynchronous manner relative to writing, and
the stream regulation device includes an amplitude detector which receives the pulses at input, and which produces, for each pulse received, an analog signal, an amplitude of which is proportional to maximum amplitude of the respective pulse, the analog signal being supplied to the buffer memory.

2. A device for converting a random stream of voltage pulses into a regulated stream of digital data, the device comprising:

a stream regulation device; and an analog-digital converter at output of the stream regulation device, wherein the converter undertakes an analog-digital conversion at a conversion frequency, the stream regulation device includes a buffer memory consisting of K analog memory cells, where K is an integer and K≥1, in which voltage signal for each received pulse is stored, in a write phase, reading of the buffer memory being regulated at the conversion frequency and undertaken in an asynchronous manner relative to writing, the stream regulation device includes a circuit which receives the pulses at input, and which produces, for each pulse received, an analog signal, an amplitude of which is proportional to maximum amplitude of the respective pulse, the analog signal being supplied to the buffer memory, and each memory cell includes:

a first switch and a second switch in series between an input and an output of the memory cell, where the first switch is connected to output of the circuit, and the second switch is connected to input of the converter, and a condensator positioned between a node common to both switches and a reference potential.

3. The device according to claim 2, wherein the regulation device includes:

another circuit which receives the pulses at input, and which produces at output a first binary signal which changes to a high level over pulse detection time, where the first binary signal is sent to a controller in order to write in the buffer memory.

4. The device according to claim 2, wherein said memory cells are arranged in parallel when K≥1.

5. The device according to claim 2, wherein the buffer memory includes a controller to change the first switch to an on state when a first binary signal changes to a high level, and to change the second switch to the on state when a second binary signal at the conversion frequency changes to a high level.

* * * * *